United States Patent
Kim et al.

(10) Patent No.: US 12,391,856 B2
(45) Date of Patent: *Aug. 19, 2025

(54) ADHESIVE COMPOSITION

(71) Applicant: LG CHEM, LTD., Seoul (KR)

(72) Inventors: So Young Kim, Daejeon (KR); Seung Min Lee, Daejeon (KR); Se Woo Yang, Daejeon (KR); Hyun Sup Lee, Daejeon (KR); Yeon Soo Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 994 days.

This patent is subject to a terminal disclaimer.

(21) Appl. No.: 16/336,037

(22) PCT Filed: Sep. 25, 2017

(86) PCT No.: PCT/KR2017/010548
§ 371 (c)(1),
(2) Date: Mar. 22, 2019

(87) PCT Pub. No.: WO2018/056776
PCT Pub. Date: Mar. 29, 2018

(65) Prior Publication Data
US 2020/0172771 A1 Jun. 4, 2020

(30) Foreign Application Priority Data
Sep. 23, 2016 (KR) .......................... 10-2016-0122469

(51) Int. Cl.
*C09J 175/16* (2006.01)
*C08K 3/013* (2018.01)
(Continued)

(52) U.S. Cl.
CPC ............. *C09J 175/16* (2013.01); *C08K 3/013* (2018.01); *C08K 3/22* (2013.01); *C08K 3/36* (2013.01);
(Continued)

(58) Field of Classification Search
CPC ...... C09J 123/22; C09J 133/08; C09J 147/00; C09J 163/00; C09J 175/04;
(Continued)

(56) References Cited

U.S. PATENT DOCUMENTS 8,933,175 B2 1/2015 Yu et al.
9,676,978 B2 6/2017 Kageyama
(Continued)

FOREIGN PATENT DOCUMENTS

CN 102834450 A 12/2012
CN 104584257 A 4/2015
(Continued)

*Primary Examiner* — Samir Shah
(74) *Attorney, Agent, or Firm* — Bryan Cave Leighton Paisner LLP (57) ABSTRACT

The present invention relates to an adhesive composition and an organic electronic device comprising the same, and provides an adhesive composition which can form a encapsulating structure capable of effectively blocking moisture or oxygen introduced from the outside into the organic electronic device, thereby securing the lifetime of the organic electronic device, and can improve processability by being easily applied in the process of forming the encapsulating structure of the organic electronic device, thereby preventing problems that air bubbles flow into the inside of the encapsulating structure or application nozzles are clogged, and an organic electronic device comprising the same.

17 Claims, 1 Drawing Sheet (51) Int. Cl.
*C08K 3/22* (2006.01)
*C08K 3/36* (2006.01)
*C08K 5/00* (2006.01)
*C08K 5/1515* (2006.01)
*C09J 123/22* (2006.01)
*C09J 123/26* (2006.01)
*C09J 133/08* (2006.01)
*C09J 147/00* (2006.01)
*C09J 163/00* (2006.01)
*C09J 175/04* (2006.01)
*H10K 50/844* (2023.01)

(52) U.S. Cl.
CPC .......... *C08K 5/0025* (2013.01); *C08K 5/1515* (2013.01); *C09J 123/22* (2013.01); *C09J 123/26* (2013.01); *C09J 133/08* (2013.01); *C09J 147/00* (2013.01); *C09J 163/00* (2013.01); *C09J 175/04* (2013.01); *C08K 2003/2206* (2013.01); *C08K 2201/005* (2013.01); *C08K 2201/006* (2013.01); *C09J 2203/326* (2013.01); *C09J 2423/00* (2013.01); *C09J 2433/00* (2013.01); *C09J 2463/00* (2013.01); *H10K 50/844* (2023.02)

(58) Field of Classification Search
CPC .............. C09J 2203/326; C09J 2423/00; C09J 2433/00; C09J 2463/00; C08K 3/013; C08K 3/22; C08K 3/36; C08K 2201/005
See application file for complete search history.

(56) References Cited

U.S. PATENT DOCUMENTS

| | | |
|---|---|---|
| 2011/0105637 A1 | 5/2011 | Fujita et al. |
| 2011/0217255 A1* | 9/2011 | Kim .................. A61K 8/72 |
| | | 525/88 |
| 2012/0283375 A1 | 11/2012 | Kageyama |
| 2012/0286220 A1 | 11/2012 | Takasu et al. |
| 2014/0048192 A1* | 2/2014 | Mabuchi ............... B60C 1/0008 |
| | | 152/510 |
| 2015/0056757 A1 | 2/2015 | Liu et al. |
| 2018/0072927 A1 | 3/2018 | Lee et al. |

FOREIGN PATENT DOCUMENTS

| | | |
|---|---|---|
| CN | 107636072 A | 1/2018 |
| JP | 2003-327952 A | 11/2003 |
| JP | 2014-162823 A | 9/2014 |
| JP | 2015-125956 A | 7/2015 |
| JP | 5983630 B2 | 8/2016 |
| KR | 10-2008-0088606 A | 10/2008 |
| KR | 10-2012-0085803 A | 8/2012 |
| KR | 10-2012-0091349 A | 8/2012 |
| KR | 10-2013-0106507 A | 9/2013 |
| KR | 10-2015-0010667 A | 1/2015 |
| KR | 10-2016-0096047 A | 8/2016 |
| KR | 1677077 B | 11/2016 |
| WO | 2011/078239 A1 | 6/2011 |

\* cited by examiner

ADHESIVE COMPOSITION

CROSS-REFERENCE TO RELATED APPLICATIONS

This application is a National Stage Entry of International Application No. PCT/KR2017/010548, filed on Sep. 25, 2017, and claims the benefit of and priority to Korean Application No. 10-2016-0122469, filed on Sep. 23, 2016, all of which are hereby incorporated by reference in their entirety for all purposes as if fully set forth herein.

TECHNICAL FIELD

The present application relates to an adhesive composition, an organic electronic device comprising the same, and a method for manufacturing the organic electronic device.

BACKGROUND ART

An organic electronic device (OED) means a device comprising an organic material layer that generates alternate current of charges using holes and electrons, and an example thereof may include a photovoltaic device, a rectifier, a transmitter and an organic light emitting diode (OLED), and the like.

The organic light emitting diode (OLED) among the organic electronic devices has less power consumption and faster response speed, and is more advantageous for thinning display devices or illumination than existing light sources. In addition, the OLED has excellent space utilization, thereby being expected to be applied in various fields covering various portable devices, monitors, notebooks and televisions.

In commercialization and pervasive use of the OLED, the major problem is a durability problem. Organic materials and metal electrodes contained in the OLED are very easily oxidized by external factors such as moisture. Thus, products containing the OLED are highly sensitive to environmental factors. Accordingly, various methods have been proposed to effectively block penetration of oxygen or moisture from the outside into organic electronic devices such as the OLED.

Patent Document 1 is directed to an adhesive encapsulating composition film and an organic electroluminescence device, which have poor workability and poor reliability under high temperature and high humidity conditions due to the PIB (polysiobutylene)-based pressure-sensitive adhesive.

PRIOR ART DOCUMENTS

Patent Documents (Patent Document 1) Korean Laid-Open Patent Publication No. 2008-0088606

DISCLOSURE

Technical Problem

The present application provides an adhesive composition which can form a encapsulating structure capable of effectively blocking moisture or oxygen introduced from the outside into the organic electronic device, thereby securing the lifetime of the organic electronic device, and can improve processability by being easily applied in the process of forming the encapsulating structure of the organic electronic device, thereby preventing problems that air bubbles flow into the inside of the encapsulating structure or application nozzles are clogged, and an organic electronic device comprising the same.

Technical Solution

The present application relates to an adhesive composition. The adhesive composition may be a seal material applied to sealing or encapsulating organic electronic devices such as, for example, OLEDs. In one example, the adhesive composition of the present application may be applied to sealing or encapsulating at least one side of an organic electronic element. Thus, after the adhesive composition has been applied to encapsulation, it may be present at the outer peripheral portion of the organic electronic device.

In this specification, the term "organic electronic device" means an article or apparatus having a structure comprising an organic material layer that generates alternate current of charges using holes and electrons between a pair of electrodes facing each other, and an example thereof may include a photovoltaic device, a rectifier, a transmitter and an organic light emitting diode (OLED), and the like, but is not limited thereto. In one example of the present application, the organic electronic device may be an OLED.

An exemplary adhesive composition for encapsulating an organic electronic element may comprise an olefin compound. The adhesive composition of the present application may have a zero shear viscosity no at any one shear rate of 0.02 to 50 s$^{-1}$ and a temperature of 25° C. in a range of 200 Pa·s to 18,000 Pa·s, 300 Pa·s to 15,000 Pa·s, or 450 Pa·s to 10,000 Pa·s. The zero shear viscosity can be measured by a method known in the art. By controlling the zero shear viscosity of the adhesive composition comprising the olefin compound to the above range, the present application can provide a seal material capable of forming a desired shape after application while improving application characteristics in forming the encapsulating structure and having excellent moisture barrier characteristics after curing.

In the present application, the viscosity according Equation 1 for the adhesive composition can be measured in a cone and plate mode using ARES (Advanced Rheometric Expansion System)-G2 from TA Corporation as follows. The Equation 1 below may be by Carreau-Yasuda model. Specifically, after loading the adhesive composition sample at a gap of 0.1 mm, the viscosity can be measured at any one shear rate of 0.02 to 50 s$^{-1}$ (arcsec) and a temperature of 25° C. According to the viscosity measurement, a shear thinning slope constant n in Equation 1 below may be in a range of 0.36 to 0.83 or 0.40 to 0.80. In addition, a time variable $\lambda$ may be in a range of 10 to 230 or 15 to 200.

$$\frac{\eta(\gamma) - \eta_\infty}{\eta_0 - \eta_\infty} = [1 + (\gamma\lambda)^a]^{\frac{n-1}{a}} \qquad [\text{Equation 1}]$$

In Equation 1 above, $\eta(\gamma)$ is a viscosity function with the shear rate, $\eta_0$ is a zero shear viscosity, $\eta_\infty$ is an infinite shear viscosity, n is a shear thinning slope constant, $\lambda$ is a time variable, a is a shear thinning approximate shape constant and $\gamma$ is a shear rate variable. Specifically, a is a constant related to the determination of how rapidly/slowly it is switched from the zero shear region to the shear thinning region, that is, the approximate shape of the switching point, and n is a constant indicating the slope degree of the viscosity descent where the shear thinning occurs. In addition, $\eta_0$ is the zero shear viscosity, which may mean the initial viscosity value of the adhesive composition and mean the viscosity that converges when the shear rate is close to zero, and $\eta_\infty$ may mean, conversely, the viscosity when the shear rate is very large, that is, converges to the infinity. Also, $\lambda$ is a time variable, which is the time from the zero shear region to the shear thinning region, and the unit may be sec. Furthermore, as described above, $\gamma$ is the shear rate variable, which is the variable that changes depending on the measuring shear rate, and $\eta(\gamma)$ is the viscosity depending on the shear rate value. Since the viscosity varies depending on the shear rate, it can be expressed as a function, as above.

In an embodiment of the present application, $\eta_\infty$ according to Equation 1 above may be in a range of 1000 Pa·s or less, or 1 to 1000 Pa·s. Furthermore, $\gamma$ may be in a range of 0.02 to 50 $s^{-1}$, and $\eta(\gamma)$ is not particularly limited, but may have a range of $\eta_0$ to $\eta_\infty$ Pa·s as a value between $\eta_0$ and $\eta_\infty$.

By controlling $\eta_0$ and/or $\eta_\infty$ values among the respective variables according to Equation 1 above related to the viscosity of the adhesive composition comprising the olefin compound to the above-described specific range, the present application can provide the encapsulating structure having excellent moisture barrier performance through the olefin compound and simultaneously prevent problems such as the inflow of air bubbles into the seal material in the encapsulating process of the organic electronic element or the clogging of the nozzle during application of the composition from occurring, thereby improving processability and productivity.

The material constituting the adhesive composition is not particularly limited as long as the physical properties are satisfied. An exemplary adhesive composition can comprise an olefin compound, a curable compound and a reactive diluent. The present application can provide a seal material having excellent endurance reliability at high temperature and high humidity while realizing an excellent moisture barrier performance and capable of achieving a desired encapsulating structure shape easily, by using the curable compound and the reactive diluent together with the olefin compound having a low water vapor transmission rate.

The olefin compound of the present application may be a resin containing at least one reactive functional group. The olefin compound may have a water vapor transmission rate of 50 g/m²·day or less.

Considering that the adhesive composition of the present application is applied to sealing or encapsulating an organic electronic device, it can provide an excellent moisture barrier property by comprising the olefin compound satisfying the water vapor transmission rate range. In this specification, the "resin having a water vapor transmission rate of 50 g/m²·day or less" may mean a resin that in a state where the resin is prepared in a form of a film formed of a resin layer having any one thickness of 10 to 100 μm, the water vapor transmission rate measured in the thickness direction of the film is measured to 50 g/m²·day or less. The water vapor transmission rate is measured under 100° F. and 100% relative humidity, which may be 50 g/m²·day or less, 40 g/m²·day or less, 30 g/m²·day or less, 20 g/m²·day or less, or 10 g/m²·day or less. Since the lower the water vapor transmission rate is, the better the moisture barrier property can be exhibited, the lower limit is not particularly limited, but may be, for example, 0 g/m²·day or 0.1 g/m²·day.

Specifically, the exemplary olefin compound of the present application comprises an olefin compound derived from a mixture of monomers, where the mixture may have an isoolefin monomer component having 4 to 7 carbon atoms or a multiolefin monomer component. The isoolefin may be present, for example, in a range of 70 to 100 wt %, or 85 to 99.5 wt %, based on the total monomer weight. The multiolefin-derived component may be present in a range of 0.5 to 30 wt %, 0.5 to 15 wt %, or 0.5 to 8 wt %.

The isoolefin may be exemplified by isobutylene, 2-methyl-1-butene, 3-methyl-1-butene, 2-methyl-2-butene, 1-butene, 2-butene, methyl vinyl ether, indene, vinyltrimethylsilane, hexene or 4-methyl-1-pentene. The multiolefin may have 4 to 14 carbon atoms and may be exemplified by, for example, isoprene, butadiene, 2,3-dimethyl-1,3-butadiene, myrcene, 6,6-dimethyl-fulvene, hexadiene, cyclopentadiene, or piperylene. Other polymerizable monomers, such as styrene and dichlorostyrene, can also be homopolymerized or copolymerized.

In the present application, the olefin compound may comprise an isobutylene-based homopolymer or copolymer. As mentioned above, the isobutylene-based olefin compound or polymer may mean an olefin compound or polymer containing 70 mol % or more of repeating units from isobutylene and at least one other polymerizable unit.

In the present application, the olefin compound may be a butyl rubber or a branched butyl rubber. An exemplary olefin compound is an unsaturated butyl rubber, such as a copolymer of olefin or isoolefin and multiolefin. As the olefin compound included in the adhesive composition of the present invention, poly(isobutylene-co-isoprene), polyisoprene, polybutadiene, polyisobutylene, poly(styrene-co-butadiene), natural rubber, a butyl rubber, and a mixture thereof can be exemplified. In the present application, the useful olefin compound may be prepared by any suitable means known in the art, where the present invention is not limited by the method of preparing olefin compounds herein.

In one example, the olefin compound may be a low molecular weight polyisobutylene resin. For example, the olefin compound may have a weight average molecular weight of 100,000 or less, 90,000 or less, 80,000 or 70,000 or less and 500 or more or 55,000 or more. In the present application, the term "weight average molecular weight" means a value converted to standard polystyrene measured by GPC (Gel Permeation Chromatograph). By controlling the weight average molecular weight of the olefin compound within the above range, the present application can realize the adhesive composition suitable for application and encapsulation processes. The adhesive composition may have a liquid phase form and may be suitably applied to the side encapsulating application of the organic electronic device to be described below.

The reactive functional group included in the olefin compound may be a polar functional group. In addition, the reactive functional group may have reactivity with the above-mentioned curable compound. The type of the reactive functional group is not limited, but may be, for example, an acid anhydride group, a carboxyl group, an epoxy group, an amino group, a hydroxyl group, an isocyanate group, an oxazoline group, an oxetane group, a cyanate group, a phenol group, a hydrazide group, or an amide group. An example of the olefin compound having a reactive functional group may include succinic anhydride modified polyisobutylene, maleic anhydride modified liquid polyisobutylene, maleic anhydride modified liquid polyisoprene, epoxy modified polyisoprene, hydroxyl group modified liquid polyisoprene or allyl-modified liquid polyisoprene. As the olefin compound as above forms a cross-linked structure with the curable compound to be described below, the present application can realize an adhesive having the desired physical properties such as moisture barrier property and handling property herein.

In one example, the adhesive composition may further comprise an inorganic filler. The inorganic filler may be included to control thixotropy of the adhesive composition separately from a moisture adsorbent to be described below. The specific kind of the usable filler in the present application is not particularly limited, and for example, one or a mixture of two or more of silica, calcium carbonate, alumina, talc, or the like may be used. In this specification, the term "thixotropy" may mean a property that the composition has no fluidity in a static state but has fluidity when vibrated.

In the present application, in order to improve coupling efficiency of the filler with an organic binder, a product surface-treated with an organic material may be used as the filler, or a coupling agent may be further added and used.

The adhesive composition of the present application may comprise 0.1 to 20 parts by weight, 1 to 18 parts by weight, or 5 to 17 parts by weight of the inorganic filler relative to 100 parts by weight of the olefin compound. By controlling the content of the inorganic filler in the above range, the present application can provide a seal material capable of realizing the desired encapsulating structure shape easily herein.

Also, the inorganic filler may have a BET (Brunauer-Emett-Teller) surface area in a range of 35 to 500 $m^2/g$, 40 to 400 $m^2/g$, 50 to 300 $m^2/g$, or 60 to 200 $m^2/g$. The specific surface area has been measured using the BET method, and specifically, it can be measured by adding a sample of the inorganic filler 1 g to a tube and using ASAP2020 (Micromeritics, USA) without pretreatment at −195° C. The average value can be obtained by measuring the same sample three times. By controlling the specific surface area of the inorganic filler in the above range, the present application can provide a seal material capable of realizing the desired encapsulating structure shape easily herein.

In an embodiment of the present application, the adhesive composition may comprise a curable compound capable of reacting with the olefin compound. The curable compound may be a thermosetting compound or a photo-curable compound. The curable compound may be a resin containing at least one or more curable functional groups. The specific kind of the usable curable compound in the present application is not particularly limited, and for example, various curable compounds known in this field can be used.

In this specification, the term "thermosetting compound" means a resin that can be cured through an appropriate heat application or aging process and the term "photo-curable compound" means a resin that can be cured by irradiation with electromagnetic waves. For example, the photo-curable compound may be a photo-cationic curable compound or a photo-radical curable compound.

The specific kind of the curable compound in the present application is not particularly limited as long as it has the above-mentioned characteristics. For example, it may include, as one which can be cured to exhibit adhesive characteristics, a resin comprising one or more heat-curable functional groups such as an epoxy group, a glycidyl group, an isocyanate group, a hydroxy group, a carboxyl group or an amide group, or comprising one or more curable functional groups by irradiation with electromagnetic waves such as an urethane group, an epoxide group, a cyclic ether group, a sulfide group, an acetal group or a lactone group. Also, the specific kind of the resin as above may include an acrylic resin, a polyester resin, an isocyanate resin or an epoxy resin, and the like, but is not limited thereto, and for example, epoxy acrylate or urethane acrylate and the like may be exemplified. The urethane acrylate may be a compound that polyisocyanate having two or more isocyanate groups in a molecule and hydroxyalkyl (meth)acrylate are reacted, and the epoxy acrylate may be a compound that an epoxy resin and (meth)acrylic acid are subjected to addition reaction.

In one example, the present application may use, as the curable compound, aromatic or aliphatic; or linear or branched epoxy resins. In one embodiment of the present invention, an epoxy resin having an epoxy equivalent of 180 g/eq to 1,000 g/eq can be used as the epoxy resin containing two or more functional groups. By using an epoxy resin having an epoxy equivalent in the above range, properties such as adhesion performance and glass transition temperature of the cured product can be effectively maintained. An example of such an epoxy resin may include one or a mixture of two or more of a cresol novolac epoxy resin, a bisphenol A epoxy resin, a bisphenol A novolac epoxy resin, a phenol novolac epoxy resin, a tetrafunctional epoxy resin, a biphenyl type epoxy resin, a triphenol methane type epoxy resin, an alkyl-modified triphenolmethane epoxy resin, a naphthalene type epoxy resin, a dicyclopentadiene type epoxy resin, or a dicyclopentadiene-modified phenol type epoxy resin.

The present application may use, as the thermosetting compound, an epoxy resin containing a cyclic structure in the molecular structure, and for example, may use an alicyclic epoxy resin. The alicyclic epoxy resin has excellent compatibility with the olefin compound or the reactive diluent to be cured without phase separation, whereby uniform cross-linking of the adhesive can be realized.

The curable compound may be a reactive oligomer compound. The compound may have a weight average molecular weight in a range of 400 to 100,000, 500 to 90,000, 600 to 70,000, 700 to 60,000, 800 to 50,000, 900 to 40,000, or 1,000 to 30,000. In the case of a reactive diluent to be described below, an epoxy compound may also be included, but it can be distinguished from the curable compound in terms of its role in the composition and can also be distinguished in its molecular weight range. The curable compound can achieve heat resistance durability after curing in the above molecular weight range.

In one example, the curable compound may be included in an amount of 10 to 70 parts by weight relative to 100 parts by weight of the olefin compound. Specifically, the curable compound may be included in an amount of 10 to 70 parts by weight, 15 to 68 parts by weight, or 25 to 65 parts by weight relative to 100 parts by weight of the olefin compound. By controlling the content in the above content range, the present application allows for the adhesive composition to be capable of securing the heat resistance after curing and can provide the adhesive composition having excellent moisture barrier characteristics or durability and reliability simultaneously.

In an embodiment of the present application, the adhesive composition may comprise a reactive diluent. The reactive diluent may have a weight average molecular weight in a range of less than 400 or 50 to 350. As long as the reactive diluent is a compound within the molecular weight range, the material thereof is not particularly limited. In this specification, the kind of the reactive diluent may be different from the above-mentioned curable compound. As the adhesive composition comprises the reactive diluents, the present application can satisfy the desired physical properties such as thixotropy, thereby providing a seal material capable of realizing the desired encapsulating structure shape easily. In addition, the adhesive composition of the present application may have a solventless type liquid form by comprising the reactive diluent.

Furthermore, in encapsulating the side of the organic electronic element, a process of applying a liquid adhesive composition is carried out, where there has been, conventionally, a problem that since the composition after application has high fluidity, it is difficult to maintain the desired encapsulation shape. In the present application, by irradiating the adhesive composition applied at a desired position with light to perform pre-curing, the final curing can proceed after the fluidity is controlled. Accordingly, the present application can keep the applied adhesive composition in the desired encapsulated shape until the final curing. That is, the present application can introduce a double curing method, whereby it is possible to control the fluidity at high temperature after the adhesive composition has been applied.

In one example, the reactive diluent may be a curable monomer. The curable monomer may comprise, for example, an epoxy compound or a multifunctional active energy ray polymerizable compound.

As an example of the reactive diluent, there is 3,4-epoxycyclohexylmethyl 3',4'-epoxycyclohexane carboxylate (EEC) and derivatives, dicyclopentadiene dioxide and derivatives, 3-ethyl-3-oxetane methanol and derivatives, diglycidyl tetrahydrophthalate and derivatives, diglycidyl hexahydrophthalate and derivatives, 1,2-ethane diglycidyl ether and derivatives, 1,3-propane diglycidyl ether and derivatives, 1,4-butanediol diglycidyl ether and derivatives, higher 1,n-alkane diglycidyl ether and derivatives, bis[(3,4-epoxycyclohexyl)methyl]adipate and derivatives, vinylcyclohexyldioxide and derivatives, 1,4-cyclohexanedimethanol bis(3,4-epoxycyclohexanecarboxylate) and derivatives, diglycidyl 4,5-epoxy tetrahydrophthalate and derivatives, bis[1-ethyl(3-oxetanyl)methyl] ether and derivatives, pentaerythrityl tetraglycidyl ether and derivatives, bisphenol A diglycidyl ether (DGEBA), hydrogenated bisphenol A diglycidyl ether, bisphenol F diglycidyl ether, hydrogenated bisphenol F diglycidyl ether, epoxyphenol novolac, hydrogenated epoxyphenol novolac, epoxycresol novolak, hydrogenated epoxycresol novolac, 2-(7-oxabicyclospiro[1,3-dioxane-5,3'-4.1.0]heptane)) or 1,4-bis((2,3-epoxypropoxy)-methyl)cyclohexane.

The multifunctional active energy ray polymerizable compound may include, for example, a multifunctional acrylate which is highly compatible with the above-mentioned olefin compound and curable compound and can form a specific cross-linked structure. Furthermore, in one embodiment, the cross-linked structure may be a cross-linked structure formed by application of heat, a cross-linked structure formed by irradiation with an active energy ray, or a cross-linked structure formed by aging at room temperature. Here, in the category of the "active energy ray," particle beams such as alpha-particle beams, proton beams, neutron beams or electron beams, or the like as well as microwaves, infrared (IR), ultraviolet (UV), X-rays and gamma rays may be included, and typically, ultraviolet rays or electron beams may be included.

The multifunctional active energy ray polymerizable compound may be, for example, a compound comprising two or more functional groups capable of participating in a polymerization reaction by irradiation with an active energy ray, for example, functional groups an ethylenicaly unsaturated double bond such as an acryloyl group, a methacryloyl group, an acryloyloxy group or a methacryloyloxy group, or functional groups such as an epoxy group or an oxetane group. In one example, the multifunctional active energy ray polymerizable compound may be a bifunctional or more compound.

In an embodiment of the present application, for example, multifunctional acrylate (MFA) may be used as the multifunctional active energy ray polymerizable compound.

In an embodiment of the present application, the radical photo-curable compound may satisfy Formula 1 below.

[Formula 1]

In Formula 1 above, $R_1$ is hydrogen or an alkyl group having 1 to 4 carbon atoms, n is a number of 2 to 10, and X represents a residue derived from a linear, branched or cyclic alkyl group or alkenyl group having 3 to 30 carbon atoms. Here, when X is a residue derived from a cyclic alkyl group or alkenyl group, X may be, for example, a residue derived from a cyclic alkyl group or alkenyl group having 3 to 30 carbon atoms, 4 to 28 carbon atoms, 6 to 28 carbon atoms, 8 to 22 carbon atoms or 12 to 20 carbon atoms. Furthermore, when X is a residue derived from a linear alkyl group or alkenyl group, X may be a residue derived from a linear alkyl group or alkenyl group having 3 to 30 carbon atoms, 4 to 28 carbon atoms, 6 to 25 carbon atoms or 8 to 20 carbon atoms. In addition, when X is a residue derived from a branched alkyl group or alkenyl group, X is a residue derived from a branched alkyl group or alkenyl group having 3 to 30 carbon atoms, 4 to 28 carbon atoms, 5 to 25 carbon atoms or 6 to 20 carbon atoms.

In this specification, the term "residue derived from an alkyl group or alkenyl group" may mean one composed of an alkyl group or alkenyl group as a residue of a specific compound. In one example, in Formula 1 above, when n is 2, the X may be an alkylene group or an alkylidene group. Also, when n is 3 or more, X may be bonded to the (meth)acroyl group of Formula 1 by eliminating two or more hydrogen atoms of the alkyl group or the alkenyl group. n may be from 2 to 20.

The term "alkyl group" or "alkenyl group" herein may mean an alkyl group or alkenyl group having 1 to 30 carbon atoms, 1 to 25 carbon atoms, 1 to 20 carbon atoms, 1 to 16 carbon atoms, 1 to 12 carbon atoms, or 1 to 4 carbon atoms, unless otherwise specified. The alkyl group or alkenyl group may have a linear, branched or cyclic structure and may optionally be substituted with one or more substituents.

The term "alkylene group" or "alkylidene group" herein may mean an alkylene group or alkylidene group having 2 to 30 carbon atoms, 2 to 25 carbon atoms, 2 to 20 carbon atoms, 2 to 16 carbon atoms, 2 to 12 carbon atoms, 2 to 10 carbon atoms or 2 to 8 carbon atoms, unless otherwise specified. The alkylene group or alkylidene group may have a linear, branched or cyclic structure and may optionally be substituted with one or more substituents.

The term "alkoxy group" may mean an alkoxy group having 1 to 20 carbon atoms, 1 to 16 carbon atoms, 1 to 12 carbon atoms, 1 to 8 carbon atoms, or 1 to 4 carbon atoms, unless otherwise specified. The alkoxy group may be linear, branched or cyclic. In addition, the alkoxy group may be optionally substituted with one or more substituents.

In one example, the multifunctional active energy ray polymerizable compound that can be polymerized by irradiation with the active energy ray may include polybutadiene dimethacrylate, 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentyl glycol di(meth)acrylate, dicyclopentanyl di(meth)acrylate, cyclohexane-1,4-dimethanol di(meth)acrylate, tricyclodecanedimethanol (meth)diacrylate, dimethyldicyclopentane di(meth)acrylate, neopentyl glycol modified trimethylpropane di(meth)acrylate, adamantine di(meth)acrylate, trimethylolpropane tri(meth)acrylate or a mixture thereof.

The reactive diluent may be included in an amount of 10 parts by weight to 100 parts by weight, 11 parts by weight to 90 parts by weight, 12 parts by weight to 80 parts by weight, 13 parts by weight to 70 parts by weight, 14 parts by weight to 65 parts by weight or 14 to 45 parts by weight relative to 100 parts by weight of the olefin compound. By controlling the content of the reactive diluent to 100 parts by weight or less, the present application allows having a viscosity suitable for application of the composition, and by controlling the content to 10 parts by weight or more, the present application can realize the desired thixotropic index herein. Furthermore, by controlling the content of the reactive diluent to the above range, the present application can provide an adhesive cured product in such an extent that the encapsulated structure can be maintained upon pre-curing.

Also, in an embodiment of the present application, the adhesive composition may comprise a curing agent or an initiator. The curing agent may be a thermosetting agent or a photo-curing agent. For example, a suitable type of curing agent may be selected and used depending on the curable compound, the kind of the functional group included in the curable compound or the reactive diluent, and one or more may be used.

In one example, the usable curing agent may be one or two or more of an amine curing agent, an imidazole curing agent, a phenol curing agent, a phosphorus curing agent or an acid anhydride curing agent, and the like, but is not limited thereto.

In one example, as the curing agent, an imidazole compound which is a solid phase at room temperature and has a melting point or decomposition temperature of 80° C. or more can be used. Such a compound can be exemplified by, for example, 2-methylimidazole, 2-heptadecylimidazole, 2-phenylimidazole, 2-phenyl-4-methylimidazole or 1-cyanoethyl-2-phenylimidazole, but is not limited thereto.

In an embodiment of the present application, the curing agent may be a latent thermosetting agent such as an imidazole-isocyanuric acid adduct, an amine-epoxy adduct, a boron trifluoride-amine complex or an encapsulated imidazole. That is, the present invention can control the initial fluidity by first performing light irradiation in the curing process of the adhesive composition, where the curing agent can cure the thermosetting compounds as a latent curing agent in the final curing step after light irradiation.

The content of the curing agent may be selected depending on compositions of the composition, for example, the kind and ratio of the curable compounds. For example, the curing agent may be included in an amount of 1 to 50 parts by weight, 2 to 30 parts by weight, 3 to 20 parts by weight or 4 to 18 parts by weight relative to 100 parts by weight of the olefin compound in the adhesive composition. The weight ratio may be adjusted depending on the curable compound or the kind and ratio of the functional groups in the curable compound or the cross-linking density to be achieved, and the like.

When the curable compound or the reactive diluent is a compound which can be cured by irradiation with active energy rays, for example, a cationic photopolymerization initiator or a photo-radical initiator can be used as an initiator.

As the cationic photopolymerization initiator, an ionized cationic initiator of onium salt or organometallic salt series or a non-ionized cationic initiator of organosilane or latent sulfonic acid series can be used. The initiator of the onium salt series can be exemplified by diaryliodonium salt, triarylsulfonium salt or aryldiazonium salt, and the like, the initiator of the organometallic salt series can be exemplified by iron arene or the like, the initiator of the organosilane series can be exemplified by o-nitrobenzyl triaryl silyl ether, triaryl silyl peroxide or acyl silane, and the like, and the initiator of the latent sulfuric acid series can be exemplified by $\alpha$-sulfonyloxy ketone or $\alpha$-hydroxymethylbenzoin sulfonate, and the like, without being limited thereto.

The radical initiator may be a photo-radical initiator. The specific kind of the photoinitiator can be appropriately selected in consideration of the curing rate and the possibility of yellowing. For example, benzoin-, hydroxy ketone-, amino ketone- or phosphine oxide-based photoinitiators, and the like can be used, and specifically, benzoin, benzoin methyl ether, benzoin ethyl ether, benzoin isopropyl ether, benzoin n-butyl ether, benzoin isobutyl ether, acetophenone, dimethylaminoacetophenone, 2,2-dimethoxy-2-phenylacetophenone, 2,2-diethoxy-2-phenylacetophenone, 2-hydroxy-2-methyl-1-phenylpropane-1-one, 1-hydroxycyclohexyl phenyl ketone, 2-methyl-1-[4-(methylthio)phenyl]-2-morpholino-propane-1-one, 4-(2-hydroxyethoxy)phenyl-2-(hydroxyl-2-propyl) ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylaminobenzoic acid ester, oligo[2-hydroxy-2-methyl-1-[4-(1-methylvinyl)phenyl]propanone] and 2,4,6-trimethylbenzoyl-diphenyl-phosphine oxide, and the like can be used.

The content of the photo-radical initiator may be varied depending on the kind and ratio of the functional group of the radical photo-curable compound or the cross-linking density to be implemented, and the like. For example, the photo-radical initiator may be blended in an amount of 0.1 to 60 parts by weight or 3 to 30 parts by weight relative to 100 parts by weight of the solid content of the adhesive composition. The present invention can introduce an appropriate cross-linked structure to the adhesive composition to realize the fluidity control at high temperature by controlling the photo-radical initiator in the above content range.

In an embodiment of the present application, the adhesive composition may comprise a radical initiator and a photo-cationic initiator together, or may comprise a thermosetting agent and a radical initiator, or a thermosetting agent and a photo-cationic initiator. The present application can introduce a double curing method by comprising at least two initiators/curing agents as above, thereby forming the desired encapsulating structure.

In one example, the adhesive composition of the present application may comprise 40 to 90 parts by weight of an olefin compound containing at least one reactive functional group, 5 to 50 parts by weight of a curable compound and 1 to 40 parts by weight of a reactive diluent. In another example, the adhesive composition may comprise 52 to 80 parts by weight of the olefin compound, 10 to 40 parts by weight of the curable compound and 5 to 28 parts by weight of the reactive diluent. The present application can provide a seal material having excellent endurance reliability at high temperature and high humidity simultaneously while realizing an excellent moisture barrier performance and also capable of achieving the desired encapsulating structure shape easily, by adjusting the content range of each component in the adhesive composition.

The adhesive composition of the present application may further comprise a moisture adsorbent. The term "moisture adsorbent" can be used to collectively mean a component capable of adsorbing or removing moisture or humidity introduced from the outside through physical or chemical reaction or the like. That is, it means a moisture-reactive adsorbent or a physical adsorbent, and a mixture thereof is also usable.

The moisture-reactive adsorbent chemically reacts with humidity, moisture or oxygen, and the like introduced into the resin composition or the cured product thereof to adsorb moisture or humidity. The physical adsorbent can increase the movement path of moisture or humidity penetrating the resin composition or the cured product thereof to suppress the penetration and can maximize the barrier characteristics to moisture and humidity through the interaction between the matrix structure of the resin composition or the cured product thereof and the moisture-reactive adsorbent or the like.

The specific kind of the usable moisture adsorbent in the present application is not particularly limited, and for example, in the case of the moisture-reactive adsorbent, it may include one or a mixture of two or more of a metal oxide, a metal salt or phosphorus pentoxide ($P_2O_5$), and the like, and in the case of the physical adsorbent, it may include zeolite, zirconia or montmorillonite, and the like.

Here, a specific example of the metal oxide may include lithium oxide ($Li_2O$), sodium oxide ($Na_2O$), barium oxide (BaO), calcium oxide (CaO) or magnesium oxide (MgO), and the like, an example of the metal salt may include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_2)_2$) or magnesium perchlorate ($Mg(ClO_4)_2$), and the like, but is not limited thereto.

In the present application, the moisture adsorbent such as the metal oxide can be compounded in the composition in a properly processed state. For example, a pulverization process of the moisture adsorbent may be required, and a process such as a three-roll mill, a bead mill or a ball mill may be used for pulverizing the moisture adsorbent.

The adhesive composition of the present application may comprise the moisture adsorbent in an amount of 5 to 100 parts by weight, 5 to 90 parts by weight, 5 to 80 parts by weight or 10 to 50 parts by weight relative to 100 parts by weight of the olefin compound. The adhesive composition of the present application can preferably control the content of the moisture adsorbent to 5 parts by weight or more so that the adhesive composition or the cured product thereof exhibits excellent moisture and humidity barrier characteristics. In addition, by controlling the content of the moisture adsorbent to 100 parts by weight or less, when the thin film encapsulating structure is formed, excellent moisture barrier characteristics can be exhibited.

In one example, the adhesive composition may be in a liquid phase at room temperature, for example, at about 25° C. In an embodiment of the present application, the adhesive composition may be a solventless type liquid phase. The adhesive composition may be applied to encapsulating an organic electronic element, and specifically, may be applied to encapsulating the side of the organic electronic element. As the adhesive composition has a liquid form at room temperature, the present application can seal the organic electronic element by a method of applying the composition to the side of the element.

The adhesive composition according to the present application may comprise various additives, in addition to the above-mentioned configurations, in the range without affecting the above-described effects of invention. For example, the resin composition may comprise a defoaming agent, a coupling agent, a tackifier, an ultraviolet stabilizer or an antioxidant, and the like in an appropriate range depending on the desired physical properties. In one example, the adhesive composition may further comprise a defoaming agent. By comprising the defoaming agent, the present application can realize the defoaming property in the above-described process of applying the adhesive composition to provide a reliable encapsulating structure. In addition, as long as the physical properties of the adhesive composition required in the present application are satisfied, the kind of the defoaming agent is not particularly limited.

An exemplary adhesive composition may have a viscosity of 700 Pa·s to 5,000 Pa·s after light irradiation. Within the viscosity range, the adhesive composition can maintain the desired shape of the encapsulating structure. In one example, the viscosity of the adhesive composition may be measured after irradiating the adhesive composition with light having a wavelength range of a UV-A region band at a light quantity of 3 J/cm$^2$. Also, the viscosity of the adhesive composition may be a viscosity measured depending on a shear stress under conditions of a temperature of 25° C., a shear rate of $10s^{-1}$ and a frequency of 1 Hz. In one example, the composition may have a viscosity of 700 Pa·s to 4,000 Pa·s, 800 Pa·s to 3,000 Pa·s, or 900 Pa·s to 2,000 Pa·s.

In this specification, the term "UV-A region" may mean a wavelength range from 315 nm to 400 nm. Specifically, the light having a wavelength range of the UV-A region band herein may mean light comprising any one wavelength in the range of 315 nm to 400 nm, or may mean light having two or more wavelengths in the range of 315 nm to 400 nm.

In an embodiment of the present application, the adhesive composition can form the encapsulating structure of the organic electronic device by conducting the final curing after irradiation with light. The final curing may proceed by irradiating the composition with heat or light. In forming the encapsulating structure, despite high final curing temperature, the UV pre-cured adhesive composition is required to have physical properties such that the final curing can be performed without changing the shape. That is, it is necessary to prevent a phenomenon that the adhesive composition spreads at high temperature, or the like. In one example, the adhesive composition may be pre-cured by being irradiated with light having a wavelength range of the UV-A region band at a light quantity of 3 J/cm², as described above, where the pre-cured resin composition may have a viscosity of 500 Pa·s to 2,000 Pa·s according to a shear stress under conditions of a temperature of 80° C., a shear rate of 10 s⁻¹ and a frequency of 1 Hz. The viscosity may be, for example, 500 Pa·s to 1,800 Pa·s, 500 Pa·s to 1,600 Pa·s, or 600 Pa·s to 1,500 Pa·s. By satisfying the viscosity range as above, the adhesive composition of the present application can be effectively applied to the side encapsulating of the organic electronic device.

An exemplary adhesive composition for encapsulating an organic electronic element may have a thixotropic index (T) according to Equation 2 below in a range of 1.35 to 5. The present application provides a seal material which has excellent moisture barrier performance and is capable of realizing a desired encapsulating structure shape easily by controlling the thixotropic index of an adhesive composition comprising an olefin compound.

$$T = V_{0.5}/V_5 \quad \text{[Equation 2]}$$

In Equation 2 above, $V_{0.5}$ is a viscosity of the adhesive composition measured at a temperature of 25° C. and a shear rate of 0.5 s⁻¹ and $V_5$ represents a viscosity of the adhesive composition measured at a temperature of 25° C. and a shear rate of 5.0 s⁻¹. The viscosity can be measured after loading a sample into a 0.1 mm gap in Cone & plate mode using ARES (Advanced Rheometric Expansion System)-G2. Or the $V_{0.5}$ may be measured by a Brookfield viscometer at a temperature of 25° C., a rotational speed of 0.5 rpm and a RV-7 spindle, or $V_5$ may be measured by a Brookfield viscometer at a temperature of 25° C., a rotational speed of 5 rpm and a RV-7 spindle.

In one example, the adhesive composition of the present application may have a thixotropic index in the range of 1.35 to 5, 1.36 to 4.5, 1.37 to 4, 1.38 to 3.5 or 1.39 to 3.3. By controlling the thixotropic index of the adhesive composition as above, the present application can provide the encapsulating structure having excellent moisture barrier performance through the olefin compound and simultaneously prevent problems such as the inflow of air bubbles into the seal material in the encapsulating process of the organic electronic element or the clogging of the nozzle during application of the composition from occurring, thereby improving processability and productivity.

Figure 1:
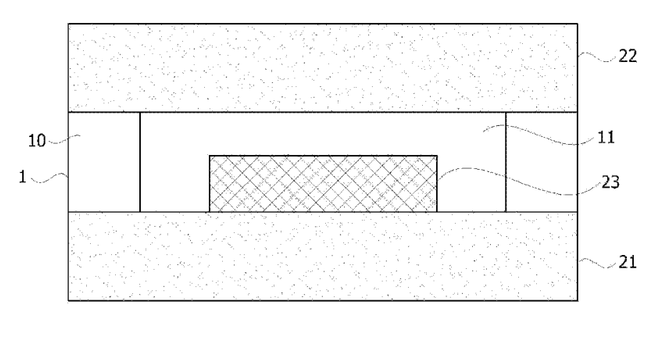
The drawing is a cross-sectional view showing an organic electronic device according to one example of the present invention.

The present application also relates to an organic electronic device. As shown in the drawing, an exemplary organic electronic device may comprise a substrate (21); an organic electronic element (23) formed on the substrate (21); and a side encapsulating layer (10) formed on the outer peripheral portion of the substrate (21) so as to surround the side of the organic electronic element (23) and comprising the above-described adhesive composition. Furthermore, the exemplary organic electronic device may further comprise a top encapsulating layer (11) covering the entire surface of the organic electronic element (23).

The top encapsulating layer and the side encapsulating layer may be present on the same plane. Here, the "same" may mean substantially the same. For example, the substantially same in the same plane means that there may be an error of ±5 μm or ±1 μm in the thickness direction. The top encapsulating layer can seal the upper surface of the element, and can also seal the side together as well as the upper surface. The side encapsulating layer may be formed on the side of the element but may not directly contact the side of the organic electronic element. For example, the top encapsulating layer can be sealed to be in direct contact with the top and sides of the element. That is, the side encapsulating layer may be located at the outer peripheral portion of the substrate, in a top view of the organic electronic device, without contacting the element.

In this specification, the term "outer peripheral portion" means the edge portion of the perimeter. That is, the outer peripheral portion of the substrate may mean the edge portion of the perimeter in the substrate.

The material constituting the side encapsulating layer is not particularly limited, but may comprise the above-mentioned adhesive composition.

On the other hand, the top encapsulating layer may comprise a encapsulating resin, where the encapsulating resin may be exemplified by an acrylic resin, an epoxy resin, a silicone resin, a fluorine resin, a styrene resin, a polyolefin resin, a thermoplastic elastomer, a polyoxyalkylene resin, a polyester resin, a polyvinyl chloride resin, a polycarbonate resin, a polyphenylene sulfide resin, a polyamide resin or a mixture thereof, and the like. The component constituting the top encapsulating layer may be the same as or different from the above-mentioned adhesive composition. However, the top encapsulating layer may comprise no or a small amount of moisture adsorbent as described above in that the top encapsulating layer is in direct contact with the element. For example, the top encapsulating layer may be included in an amount of 0 to 20 parts by weight relative to 100 parts by weight of the encapsulating resin.

In one example, the organic electronic element may comprise a reflective electrode layer formed on a substrate, an organic layer formed on the reflective electrode layer and comprising at least a light emitting layer, and a transparent electrode layer formed on the organic layer.

In the present application, the organic electronic element (23) may be an organic light emitting diode.

In one example, the organic electronic device according to the present application may be a top emission type, but is not limited thereto, and may be applied to a bottom emission type.

The organic electronic device may further comprise a protective film for protecting the organic electronic element between the above-described top encapsulating layer or side encapsulating layer and the organic electronic element.

The present application also relates to a method for manufacturing an organic electronic device.

In one example, the manufacturing method may comprise a step of applying the above-described adhesive composition on the outer peripheral portion of a substrate (21), on which an organic electronic element (23) is formed, so as to surround the side of the organic electronic element (23). The step of applying the adhesive composition may be a step of forming the side encapsulating layer (10) as described above.

Specifically, the step of forming the side encapsulating layer may comprise the step of applying the above-described adhesive composition so as to surround the side of the organic electronic element (23), and may further comprise a step of curing the adhesive composition. The curing step may comprise steps of pre-curing the adhesive composition and finally curing the adhesive composition. The pre-curing step may comprise irradiating it with light, and the final curing step may comprise irradiating it with light or applying heat.

Here, the substrate (21) on which the organic electronic element (23) is formed may be manufactured by forming a reflective electrode or a transparent electrode on a substrate (21) such as a glass or a film with a method such as vacuum deposition or sputtering, and forming an organic material layer on the reflective electrode. The organic material layer may comprise a hole injecting layer, a hole transporting layer, a light emitting layer, an electron injecting layer and/or an electron transporting layer. Subsequently, a second electrode is further formed on the organic material layer. The second electrode may be a transparent electrode or a reflective electrode. Then, the above-described side encapsulating layer (10) is applied on the outer peripheral portion of the substrate (21) so as to cover the side of the organic electronic element (23). At this time, the method of forming the side encapsulating layer (10) is not particularly limited, and a process such as screen printing or dispenser application of the above-described adhesive composition to the side of the substrate (21) may be used. Also, a top encapsulating layer (11) for encapsulating the entire surface of the organic electronic element (23) can be applied. As the method of forming the top encapsulating layer (11), a well-known method in the art can be applied, and for example, a liquid drop injection (one drop fill) process can be used.

In addition, in the present invention, a curing process may also be performed on the top or side encapsulating layer that seals the organic electronic device, where such a curing process (final curing) may proceed, for example, in a heating chamber or a UV chamber, preferably, in both. The conditions upon finally curing can be appropriately selected in consideration of stability of the organic electronic device, or the like.

In one example, after applying the above-described adhesive composition, the composition may be irradiated with light to induce cross-linking. The light irradiation may comprise irradiating it with light having a wavelength range of the UV-A region band at a light quantity of 0.3 to 6 J/cm$^2$ or a light quantity of 0.5 to 4 J/cm$^2$. As described above, by pre-curing the composition through irradiation with light, it is possible to realize a encapsulating structure shape capable of becoming a basis.

In one example, the manufacturing method may comprise finally curing the pre-cured adhesive composition after light irradiation. The final curing may further comprise thermally curing at a temperature of 40 to 200° C., 50 to 180° C., 60 to 150° C., 70 to 130° C. or 80 to 120° C. for 20 minutes to 24 hours, 30 minutes to 24 hours, 1 hour to 24 hours, 1 hour to 20 hours, 1 hour to 10 hours or 1 hour to 5 hours. Alternatively, the final curing may comprise irradiating it with light having a wavelength range of the UV-A region band at a light quantity of 0.3 to 6 J/cm$^2$ or a light quantity of 0.5 to 4 J/cm$^2$. Through the step of applying heat or the step of light irradiation, the adhesive composition can perform the final curing.

Advantageous Effects

The present application provides an adhesive composition which can form a encapsulating structure capable of effectively blocking moisture or oxygen introduced from the outside into the organic electronic device, thereby securing the lifetime of the organic electronic device, and can improve processability by being easily applied in the process of forming the encapsulating structure of the organic electronic device, thereby preventing problems that air bubbles flow into the inside of the encapsulating structure or application nozzles are clogged, and an organic electronic device comprising the same.

EXPLANATION OF REFERENCE NUMERALS

1: adhesive
10: side encapsulating layer
11: top encapsulating layer
21: substrate
22: cover substrate
23: organic electronic element

BEST MODE

Hereinafter, the present invention will be described in more detail with reference to Examples according to the present invention and Comparative Examples not complying with the present invention, but the scope of the present invention is not limited by the following examples.

EXAMPLE 1

An acid anhydride modified polyisobutylene resin (BASF, Mn 1000 g/mol, Glissopal SA) as an olefin compound; an alicyclic epoxy resin (Kukdo Chemical, ST-3000, epoxy equivalent 230 g/eq, viscosity 3000 cPs), epoxy acrylate (Sartomer, CN110) and urethane acrylate (Sartomer, CN307) as curable compounds; and an alicyclic epoxy compound (Celloxide 2021P, Mw: 250, Daicel corporation, hereinafter, often referred to as C2021P) and 1,6-hexanediol diacrylate (HDDA) as reactive diluents were introduced as the main component into a mixing vessel in a weight ratio of 70:5:10:5:5:5 (GlissopalSA: ST-3000: CN110: CN307: Celloxide2021P: HDDA) at room temperature. A photo-cationic initiator (San-apro, CPI-101A) was introduced into the vessel in an amount of 10 parts by weight relative to 100 parts by weight of the main component, 2,2-dimethoxy-1,2-diphenylethane-1-one (Irgacure 651, Ciba) as a radical initiator was introduced into the vessel in an amount of 5 parts by weight relative to 100 parts by weight of the main component and an imidazole curing agent (Adeka, EH-4357S), a latent curing agent, as a thermosetting agent was introduced thereto in an amount of 5 parts by weight relative to 100 parts by weight of the main component. In addition, fumed silica (Aerosil, Evonik, R805, particle size of 10 to 20 nm, BET=150 m$^2$/g) as an inorganic filler was introduced into the vessel in an amount of 4 parts by weight relative to 100 parts by weight of the main component. On the other hand, calcium oxide (CaO, Aldrich) as a moisture adsorbent was further introduced into the vessel in an amount of 15 parts by weight relative to 100 parts by weight of the main component.

In the mixing vessel, a uniform composition solution was prepared using a planetary mixer (Kurabo, KK-250s).

EXAMPLE 2

An acid anhydride modified polyisobutylene resin (BASF, Mn 1000 g/mol, Glissopal SA) as an olefin compound; an alicyclic epoxy resin (Kukdo Chemical, ST-3000, epoxy equivalent 230 g/eq, viscosity 3000 cPs) and urethane acrylate (Sartomer, CN307) as curable compounds; and an alicyclic epoxy compound (Celloxide 2021P, Mw: 250, Daicel corporation) and 1,6-hexanediol diacrylate (HDDA) as reactive diluents were introduced as the main component into a mixing vessel in a weight ratio of 55:10:15:6:4 (GlissopalSA: ST-3000: CN307: Celloxide2021P: HDDA) at room temperature. 2,2-Dimethoxy-1,2-diphenylethane-1-one (Irgacure 651, Ciba) as a radical initiator was introduced into the vessel in an amount of 5 parts by weight relative to 100 parts by weight of the main component and a photo-cationic initiator (San-apro, CPI-101A) was introduced into the vessel in an amount of 5 parts by weight relative to 100 parts by weight of the main component. In addition, fumed silica (Aerosil, Evonik, R805, particle size of 10 to 20 nm, BET=150 m$^2$/g) as an inorganic filler was introduced into the vessel in an amount of 8 parts by weight relative to 100 parts by weight of the main component. On the other hand, calcium oxide (CaO, Aldrich) as a moisture adsorbent was further introduced into the vessel in an amount of 15 parts by weight relative to 100 parts by weight of the main component.

In the mixing vessel, a uniform composition solution was prepared using a planetary mixer (Kurabo, KK-250s).

EXAMPLE 3

An acid anhydride modified polyisobutylene resin (BASF, Mn 1000 g/mol, Glissopal SA) as an olefin compound; epoxy acrylate (Sartomer, CN110) as a curable compound; and 1,6-hexanediol diacrylate (HDDA) as a reactive diluent were introduced as the main component into a mixing vessel in a weight ratio of 60:30:10 (GlissopalSA: CN110: HDDA) at room temperature. 2,2-Dimethoxy-1,2-diphenylethane-l-one (Irgacure 651, Ciba) as a radical initiator was introduced into the vessel in an amount of 5 parts by weight relative to 100 parts by weight of the main component and an imidazole curing agent (Adeka, EH-4357S) as a thermosetting agent was introduced thereto in an amount of 10 parts by weight relative to 100 parts by weight of the main component. In addition, fumed silica (Aerosil, Evonik, R805, particle size of 10 to 20 nm, BET=150 m$^2$/g) as an inorganic filler was introduced into the vessel in an amount of 10 parts by weight relative to 100 parts by weight of the main component. On the other hand, calcium oxide (CaO, Aldrich) as a moisture adsorbent was further introduced into the vessel in an amount of 15 parts by weight relative to 100 parts by weight of the main component.

In the mixing vessel, a uniform composition solution was prepared using a planetary mixer (Kurabo, KK-250s).

EXAMPLE 4

An acid anhydride modified polyisobutylene resin (BASF, Mn 1000 g/mol, Glissopal SA) as an olefin compound; an alicyclic epoxy resin (Kukdo Chemical, ST-3000, epoxy equivalent 230 g/eq, viscosity 3000 cPs) and urethane acrylate (Sartomer, CN307) as curable compounds; and an alicyclic epoxy compound (Celloxide 2021P, Mw: 250, Daicel corporation) and 1,6-hexanediol diacrylate (HDDA) as reactive diluents were introduced as the main component into a mixing vessel in a weight ratio of 55:5:30:5:5 (GlissopalSA: ST-3000: CN307: Celloxide2021P: HDDA) at room temperature. A photo-cationic initiator (San-apro, CPI-101A) was introduced into the vessel in an amount of 5 parts by weight relative to 100 parts by weight of the main component and 2,2-dimethoxy-1,2-diphenylethane- 1-one (Irgacure 651, Ciba) as a radical initiator was introduced into the vessel in an amount of 5 parts by weight relative to 100 parts by weight of the main component. In addition, fumed silica (Aerosil, Evonik, R805, particle size of 10 to 20 nm, BET=150 m$^2$/g) as an inorganic filler was introduced into the vessel in an amount of 7 parts by weight relative to 100 parts by weight of the main component. On the other hand, calcium oxide (CaO, Aldrich) as a moisture adsorbent was further introduced into the vessel in an amount of 15 parts by weight relative to 100 parts by weight of the main component.

In the mixing vessel, a uniform composition solution was prepared using a planetary mixer (Kurabo, KK-250s).

COMPARATIVE EXAMPLE 1

A polyisobutylene resin (BASF, B14, Mw=60,000) as an olefin compound; an alicyclic epoxy resin (Kukdo Chemical, ST-3000, epoxy equivalent 230 g/eq, viscosity 3000 cPs) and epoxy acrylate (Sartomer, CN110) as curable compounds; and an alicyclic epoxy compound (Celloxide 2021P, Mw: 250, Daicel corporation) and 1,6-hexanediol diacrylate (HDDA) as reactive diluents were introduced as the main component into a mixing vessel in a weight ratio of 70:15:5:8:2 (B14: ST-3000: CN110: Celloxide2021P: HDDA) at room temperature. 2,2-Dimethoxy-1,2-diphenylethane- 1-one (Irgacure 651, Ciba) as a radical initiator was introduced into the vessel in an amount of 5 parts by weight relative to 100 parts by weight of the main component and an imidazole curing agent (Adeka, EH-4357S) as a thermosetting agent was introduced thereto in an amount of 5 parts by weight relative to 100 parts by weight of the main component. In addition, fumed silica (Aerosil, Evonik, R805, particle size of 10 to 20 nm, BET=150 m$^2$/g) as an inorganic filler was introduced into the vessel in an amount of 6 parts by weight relative to 100 parts by weight of the main component. On the other hand, calcium oxide (CaO, Aldrich) as a moisture adsorbent was further introduced into the vessel in an amount of 15 parts by weight relative to 100 parts by weight of the main component.

In the mixing vessel, a uniform composition solution was prepared using a planetary mixer (Kurabo, KK-250s).

COMPARATIVE EXAMPLE 2

An acid anhydride modified polyisobutylene resin (BASF, Mn 1000 g/mol, Glissopal SA) as an olefin compound; an alicyclic epoxy resin (Kukdo Chemical, ST-3000, epoxy equivalent 230 g/eq, viscosity 3000 cPs) and epoxy acrylate (Sartomer, CN110) as curable compounds; and an alicyclic epoxy compound (Celloxide 2021P, Mw: 250, Daicel corporation) and 1,6-hexanediol diacrylate (HDDA) as reactive diluents were introduced as the main component into a mixing vessel in a weight ratio of 50:10:10:20:10 (GlissopalSA: ST-3000: CN110: Celloxide2021P: HDDA) at room temperature. 2,2-Dimethoxy-1,2-diphenylethane-1-one (Irgacure 651, Ciba) as a radical initiator was introduced into the vessel in an amount of 5 parts by weight relative to 100 parts by weight of the main component. In addition, fumed silica (Aerosil, Evonik, R805, particle size of 10 to 20 nm, BET=150 m$^2$/g) as an inorganic filler was introduced into the vessel in an amount of 2 parts by weight relative to 100 parts by weight of the main component. On the other hand, calcium oxide (CaO, Aldrich) as a moisture adsorbent was further introduced into the vessel in an amount of 15 parts by weight relative to 100 parts by weight of the main component.

In the mixing vessel, a uniform composition solution was prepared using a planetary mixer (Kurabo, KK-250s).

COMPARATIVE EXAMPLE 3

An acid anhydride modified polyisobutylene resin (BASF, Mn 1000 g/mol, Glissopal SA) as an olefin compound; an alicyclic epoxy resin (Kukdo Chemical, ST-3000, epoxy equivalent 230 g/eq, viscosity 3000 cPs), epoxy acrylate (Sartomer, CN110) and urethane acrylate (Sartomer, CN307) as curable compounds; and an alicyclic epoxy compound (Celloxide 2021P, Mw: 250, Daicel corporation) and 1,6-hexanediol diacrylate (HDDA) as reactive diluents were introduced as the main component into a mixing vessel in a weight ratio of 30:20:20:10:5:15 (GlissopalSA: ST-3000: CN110: CN307: Celloxide2021P: HDDA) at room temperature. 2,2-Dimethoxy-1,2-diphenylethane-1-one (Irgacure 651, Ciba) as a radical initiator was introduced into the vessel in an amount of 5 parts by weight relative to 100 parts by weight of the main component and an imidazole curing agent (Adeka, EH-4357S) as a thermosetting agent was introduced thereto in an amount of 10 parts by weight relative to 100 parts by weight of the main component. In addition, fumed silica (Aerosil, Evonik, R805, particle size of 10 to 20 nm, BET=150 m²/g) as an inorganic filler was introduced into the vessel in an amount of 3 parts by weight relative to 100 parts by weight of the main component. On the other hand, calcium oxide (CaO, Aldrich) as a moisture adsorbent was further introduced into the vessel in an amount of 15 parts by weight relative to 100 parts by weight of the main component.

In the mixing vessel, a uniform composition solution was prepared using a planetary mixer (Kurabo, KK-250s).

COMPARATIVE EXAMPLE 4

An acid anhydride modified polyisobutylene resin (BASF, Mn 1000 g/mol, Glissopal SA) as an olefin compound; an alicyclic epoxy resin (Kukdo Chemical, ST-3000, epoxy equivalent 230 g/eq, viscosity 3000 cPs), epoxy acrylate (Sartomer, CN110) and urethane acrylate (Sartomer, CN307) as curable compounds; and 1,6-hexanediol diacrylate (HDDA) as a reactive diluent were introduced as the main component into a mixing vessel in a weight ratio of 30:20:30:10:10 (GlissopalSA: ST-3000: CN110: CN307: HDDA) at room temperature. 2,2-Dimethoxy-1,2-diphenylethane-1-one (Irgacure 651, Ciba) as a radical initiator was introduced into the vessel in an amount of 5 parts by weight relative to 100 parts by weight of the main component and an imidazole curing agent (Adeka, EH-4357S), a latent curing agent, as a thermosetting agent was introduced thereto in an amount of 5 parts by weight relative to 100 parts by weight of the main component. In addition, fumed silica (Aerosil, Evonik, R805, particle size of 10 to 20 nm, BET=150 m²/g) as an inorganic filler was introduced into the vessel in an amount of 3 parts by weight relative to 100 parts by weight of the main component. On the other hand, calcium oxide (CaO, Aldrich) as a moisture adsorbent was further introduced into the vessel in an amount of 15 parts by weight relative to 100 parts by weight of the main component.

In the mixing vessel, a uniform composition solution was prepared using a planetary mixer (Kurabo, KK-250s).

The compositions of Examples and Comparative Examples above were shown in Table 1 below, and the respective compositions were blended in the weight ratios shown in Table 1 below.

TABLE 1

|  | Example | | | | Comparative Example | | | |
| --- | --- | --- | --- | --- | --- | --- | --- | --- |
|  | 1 | 2 | 3 | 4 | 1 | 2 | 3 | 4 |
| PIBSA | 70 | 55 | 60 | 55 |  | 50 | 30 | 30 |
| PIB |  |  |  |  | 70 |  |  |  |
| ST-3000 | 5 | 10 |  | 5 | 15 | 10 | 20 | 20 |
| CN110 | 10 |  | 30 |  | 5 | 10 | 20 | 30 |
| CN307 | 5 | 15 |  | 30 |  |  | 10 | 10 |
| C2021P | 5 | 6 |  | 5 | 8 | 20 | 5 |  |
| HDDA | 5 | 4 | 10 | 5 | 2 | 10 | 15 | 10 |
| R805 | 4 | 8 | 10 | 7 | 6 | 2 | 3 | 3 |
| CaO | 15 | 15 | 15 | 15 | 15 | 15 | 15 | 15 |
| CPI-101A | 10 | 5 |  | 5 |  |  |  |  |
| Irgacure651 | 5 | 5 | 5 | 5 | 5 | 5 | 5 | 5 |
| EH-4357S | 5 |  | 10 |  | 5 |  | 10 | 5 |

Hereinafter, the physical properties in Examples and Comparative Examples were evaluated in the following manner.

1. Measurement of Viscosity

The viscosity according Equation 1 for each adhesive composition prepared in Examples and Comparative Examples was measured in a cone and plate mode using ARES (Advanced Rheometric Expansion System)-G2 from TA Corporation as follows. Specifically, an angle of the cone was 0.1002 rad and after loading the adhesive composition sample at a gap of 0.1 mm, the viscosity was measured at any one shear rate of 0.02 to 505$^{-1}$ and a temperature of 25° C. Through the viscosity measured above, the respective variables were calculated according to Equation 1 below.

$$\frac{\eta(\gamma) - \eta_\infty}{\eta_0 - \eta_\infty} = [1 + (\gamma\lambda)^a]^{\frac{n-1}{a}} \quad \text{[Equation 1]}$$

2. Application Characteristics

The application characteristics were observed while side-applying each adhesive composition solution prepared in Examples or Comparative Examples on a 0.7 T Soda-Lime glass using a Musashi 200DS instrument to form a square having a size of 150 mm×150 mm (needle number: #18, dispensing speed: 10 mm/sec). When there was no inflow of air bubbles and no nozzle clogging of the instrument during application, it was represented by O; when air bubbles were introduced during application or the original shape was lost after application and the solution spread widely, it was represented by Δ; and when a large amount of air bubbles were introduced during application or the nozzle was clogged and the application was cut off, it was represented by X.

3. Sedimentation Stability

The sedimentation stability of the adhesive compositions of Examples and Comparative Examples was evaluated as follows. The adhesive composition prepared above was compounded and defoamed, then injected into a syringe and allowed to stand at 25° C. for 3 days. Thereafter, it was evaluated whether or not the inorganic filler settled in the bottom part of the syringe through application. When the upper and lower layers were applied with a uniform amount of inorganic filler and there was no nozzle clogging, it was represented by O; and when the nozzle was clogged during application and the upper layer was transparent as compared to the lower layer, it was represented by X.

4. Heat Resistance and Moisture Resistance

Each adhesive composition solution prepared in Examples or Comparative Examples was side-applied on a 0.7 T Soda-Lime glass using a Musashi 200DS instrument to form a square having a size of 150 mm×150 mm Thereafter, a sample was prepared by laminating it with the same glass, and the adhesive composition was irradiated with light (metal halide lamp) having a wavelength range of the UV-A region band at a light quantity of 3 J/cm², and then heated in an oven at 100° C. for 3 hours. The sample was then maintained in a constant temperature and humidity chamber at 85° C. and 85% relative humidity for about 1000 hours.

The heat resistance measurement was represented as O in the case where there was no change in the inside and the side of the application area, and as X in the case where voids occurred inside the application area.

The moisture resistance measurement was represented as O when there was no lifting of the area to which moisture was penetrated, and as X when the moisture penetration site was lifted from the glass.

4. Compatibility

The compatibility of the adhesive compositions of Examples and Comparative Examples was evaluated as follows. The prepared adhesive composition was allowed to stand in a container at 25° C. for 3 days, and then the presence of phase-separation was observed. When no phase separation occurred in the composition, it was represented by O; when the phase separation occurred partially, it was represented by Δ; and when the phase separation occurred in the two layers, it was represented by X.

$$\frac{\eta(\gamma) - \eta_\infty}{\eta_0 - \eta_\infty} = [1 + (\gamma\lambda)^a]^{\frac{n-1}{a}} \qquad \text{[Equation 1]}$$

wherein, $\eta(\gamma)$ is a viscosity function with the shear rate, $\eta_0$ is the zero shear viscosity, $\eta_\infty$ is an infinite shear viscosity, n is the shear thinning slope constant, $\lambda$ is a time variable, a is a shear thinning approximate shape constant and $\gamma$ is a shear rate variable.

3. The adhesive composition according to claim 2, wherein $\lambda$ is in a range of 10 to 230.

4. The adhesive composition according to claim 1, wherein the olefin compound has a weight average molecular weight of 100,000 or less.

5. The adhesive composition according to claim 1, wherein the reactive functional group comprises an acid anhydride group, a carboxyl group, an epoxy group, an amino group, a hydroxyl group, an isocyanate group, an oxazoline group, an oxetane group, a cyanate group, a phenol group, a hydrazide group or an amide group.

6. The adhesive composition of claim 1, further comprising an inorganic filler.

7. The adhesive composition according to claim 6, wherein the inorganic filler has a BET specific surface area in a range of 35 m²/g to 500 m²/g.

TABLE 2

| | | $\eta_0$ (Pa·s) | n | $\lambda$ (sec) | Application characteristics | Sedimentation stability | Heat resistance/ moisture resistance | Compatibility |
|---|---|---|---|---|---|---|---|---|
| Example | 1 | 607 | 0.77 | 19 | O | O | O/O | O |
| | 2 | 1730 | 0.64 | 26 | O | O | O/O | O |
| | 3 | 1871 | 0.49 | 50 | O | O | O/O | O |
| | 4 | 6058 | 0.42 | 120 | O | O | O/O | O |
| Comparative Example | 1 | 22890 | 0.30 | 250 | X | O | X/O | X |
| | 2 | 165 | 0.88 | 90 | Δ | X | O/X | O |
| | 3 | 117 | 0.91 | 39 | O | O | O/X | Δ |
| | 4 | 18854 | 0.23 | 203 | X | O | O/X | Δ |

The invention claimed is:

1. An adhesive composition for encapsulating an organic electronic element comprising:
    an olefin compound having at least one reactive functional group;
    a curable compound;
    a reactive diluent; and
    a photo-cationic initiator and a radical initiator; a thermosetting agent and a radical initiator; or a thermosetting agent and a photo-cationic initiator,
    wherein the curable compound comprises an epoxy acrylate or a urethane acrylate,
    wherein the reactive diluent has a weight average molecular weight of less than 400 and is comprised in an amount of 10 to 100 parts by weight relative to 100 parts by weight of the olefin compound,
    wherein the adhesive composition has a zero shear viscosity $\eta_0$ in a range of 200 Pa·s to 18,000 Pa·s at any one shear rate of 0.02 to 50s$^{-1}$ and at a temperature of 25° C., and
    wherein the adhesive composition is a solventless-type liquid at 25° C.

2. The adhesive composition for encapsulating an organic electronic element according to claim 1, wherein a shear thinning slope constant n in Equation 1 below is in a range of 0.36 to 0.83.

8. The adhesive composition according to claim 6, wherein the inorganic filler is comprised in an amount of 0.1 to 20 parts by weight relative to 100 parts by weight of the olefin compound.

9. The adhesive composition according to claim 1, wherein the curable compound is a reactive oligomer compound.

10. The adhesive composition of claim 1, wherein the curable compound has a weight average molecular weight in a range of from 400 to 100,000.

11. The adhesive composition according to claim 1, wherein the curable compound is comprised in an amount of 10 to 70 parts by weight relative to 100 parts by weight of the olefin compound.

12. The adhesive composition according to claim 1, wherein the reactive diluent comprises an epoxy compound or a multifunctional active energy ray polymerizable compound.

13. The adhesive composition according to claim 1, further comprising a moisture adsorbent.

14. The adhesive composition according to claim 13, wherein the moisture adsorbent comprises a moisture-reactive adsorbent or a physical adsorbent.

15. An organic electronic device comprising:
    a substrate;

an organic electronic element formed on the substrate; and a side encapsulating layer formed on the outer peripheral portion of said substrate so as to surround the side of said organic electronic element and comprising the adhesive composition according to claim 1.

16. The organic electronic device according to claim 15, further comprising a top encapsulating layer covering the entire surface of the organic electronic element, wherein said top encapsulating layer and said side encapsulating layer are present on the same plane.

17. A method for manufacturing an organic electronic device comprising steps of:

applying the adhesive composition of claim 1 on an outer peripheral portion of a substrate, on which an organic electronic element is formed, so as to surround a side of said organic electronic element; and curing said adhesive composition.

* * * * *